(12) United States Patent
Dou (10) Patent No.: US 12,345,745 B2
(45) Date of Patent: Jul. 1, 2025

(54) THRESHOLD VOLTAGE DETECTION METHOD, DETECTION DEVICE, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Wei Dou, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,509

(22) PCT Filed: Dec. 22, 2021

(86) PCT No.: PCT/CN2021/140624
§ 371 (c)(1),
(2) Date: Jun. 22, 2023

(87) PCT Pub. No.: WO2023/108778
PCT Pub. Date: Jun. 22, 2023

(65) Prior Publication Data
US 2024/0044950 A1    Feb. 8, 2024

(30) Foreign Application Priority Data
Dec. 17, 2021  (CN) .................. 202111555328.6

(51) Int. Cl.
*G01R 19/165*  (2006.01)
*G09G 3/3233*  (2016.01)

(52) U.S. Cl.
CPC ..... *G01R 19/16576* (2013.01); *G09G 3/3233* (2013.01); *G09G 2300/0819* (2013.01);
(Continued)

(58) Field of Classification Search
CPC ................................ G01R 19/16576
See application file for complete search history.

(56) References Cited

U.S. PATENT DOCUMENTS

2010/0321367 A1   12/2010   Shona

FOREIGN PATENT DOCUMENTS

CN     106097943 A     11/2016
CN     106782320 A      5/2017
(Continued)

OTHER PUBLICATIONS

International Search Report in International application No. PCT/CN2021/140624, mailed on Jul. 28, 2022.
(Continued)

*Primary Examiner* — Alesa Allgood
(74) *Attorney, Agent, or Firm* — PV IP PC; Wei Te Chung (57) ABSTRACT

A threshold voltage detection method is provided by the present application. A driving current flowing through the driving transistor during a detection process can be constant by a new detection time sequence. A voltage of the drain electrode of the driving transistor is raised to a preset voltage within a detection time by iterating for multiple iterations by an iterative method, to acquire a target threshold voltage.

20 Claims, 3 Drawing Sheets

(52) U.S. Cl.
CPC ............... *G09G 2300/0842* (2013.01); *G09G 2310/08* (2013.01); *G09G 2320/0233* (2013.01); *G09G 2320/045* (2013.01)

(56) References Cited

FOREIGN PATENT DOCUMENTS

| | | | |
|---|---|---|---|
| CN | 108510922 A | 9/2018 | |
| CN | 109119026 A | 1/2019 | |
| CN | 111312167 A | 6/2020 | |
| CN | 112562557 | * 12/2020 | ............. G09G 3/006 |
| CN | 112562557 A | 3/2021 | |
| CN | 114038421 A | 2/2022 | |
| JP | 2009098166 A | 5/2009 | |

OTHER PUBLICATIONS

Written Opinion of the International Search Authority in International application No. PCT/CN2021/140624, mailed on Jul. 28, 2022.
Chinese Office Action issued in corresponding Chinese Patent Application No. 202111555328.6 dated Mar. 31, 2023, pp. 1-8.

* cited by examiner

THRESHOLD VOLTAGE DETECTION METHOD, DETECTION DEVICE, AND DISPLAY DEVICE

FIELD OF INVENTION

The present application relates to display technologies, and more particularly, to a threshold voltage detection method, a detection device, and a display device.

BACKGROUND OF INVENTION

Organic light-emitting diode display devices are divided into passive-matrix type and active-matrix type according to the driving mode, namely, a direct addressing and a thin film transistor matrix addressing. In the active-matrix type driving mode, the pixel driving circuit is provided with a driving transistor for driving the organic light emitting diode to emit light. Since the driving transistor works in a saturation region, the current flowing through the driving transistor will be affected by the threshold voltage and mobility of the driving transistor itself. Therefore, in order to ensure a uniformity of the display brightness of the organic light emitting diode display device, a threshold voltage difference and a mobility difference between different sub-pixels need to be compensated.

The traditional threshold voltage detection method uses an initial Vgs (gate-source voltage) for a provided driving transistor, and then uses a source-following method to keep the gate voltage of the driving transistor unchanged and raise the source voltage of the driving transistor to state of Vgs=Vth (threshold voltage of the driving transistor), the current flowing through the driving transistor approaches zero, the source voltage of the driving transistor in this state is sampled, the threshold voltage of the driving transistor is calculated. Then superimpose the obtained threshold voltage on the display data voltage to compensate for the threshold voltage difference and eliminate the unevenness of the display brightness caused by the threshold voltage difference.

However, as Vgs decreases during detection and the parasitic capacitance of the detection circuit is much larger than the storage capacitance of a single sub-pixel, the source voltage of the driving transistor rises more and more slowly. If the driving of the sub-pixel is to be fully detected, it takes a long time to fully detect the threshold voltage of the driving transistor of the sub-pixel. This will greatly affect a production capacity of a factory and an investment of detection equipment. In addition, because the detection of the threshold voltage can only be performed under a black screen, the standby time before or after the user is turned off will become longer, which greatly affects user experience.

The present application provides a threshold voltage detection method, which can shorten a threshold voltage detection time of the driving transistor, thereby improving a threshold voltage detection efficiency of the driving transistor, and improving the user experience.

SUMMARY OF INVENTION

The present application provides a threshold voltage detection method, which can shorten a threshold voltage detection time of the driving transistor, thereby improving a threshold voltage detection efficiency of the driving transistor, and improving the user experience.

In a first aspect, the present application provides a threshold voltage detection method, including:
step S1. providing a pixel including a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node;
step S2, initializing a voltage of the first node to turn on the driving transistor;
step S3, maintaining a driving current flowing through the driving transistor unchanged, and detecting a voltage of the second node after a preset time period interval;
step S4: acquiring an initial threshold voltage according to the voltage of the second node and a preset voltage;
step S5: comparing the voltage of the second node with the preset voltage, and acquiring a target threshold voltage according to the initial threshold voltage if the voltage of the second node is equal to the preset voltage.

In the threshold voltage detection method provided by the present application, the threshold voltage detection method further includes returning to step S2 if the voltage of the second node is not equal to the preset voltage.

In the threshold voltage detection method provided by the present application, the step S2 specifically includes: the scan line suppling a scan signal to turn on the first transistor, and the data line suppling an initial gate voltage to the first node, wherein
$Vdata_n = Vdata_{n-1} + Vth_{n-1}$, wherein n represents a number of initializations, $Vdata_n$ represents an initial gate voltage when the first node is initialized for nth times, $Vdata_{n-1}$ represents an initial gate voltage when the first node is initialized for n−1th times, $Vth_{n-1}$ represents an initial threshold voltage when the voltage of the second node is detected for n−1th times, and wherein n is an integer greater than 1.

In the threshold voltage detection method provided by the present application, when the first node is initialized first time, the step S2 specifically includes: the scan line supplying the scan signal to turn on the first transistor, the data line supplying a preset gate voltage to the first node; and the control line suppling a detection control signal to turn on the second transistor, and the sampling line suppling a preset drain voltage to the second node.

In the threshold voltage detection method provided by the present application, the preset voltage is greater than the preset drain voltage, and wherein a difference value between the preset gate voltage and the preset drain voltage is greater than the threshold voltage of the driving transistor.

In the threshold voltage detection method provided by the present application, the step S3 specifically includes: controlling the first transistor turned off, controlling the second transistor turned on, and controlling the sampling line to be in a floating state, to maintain a driving current flowing through the driving transistor unchanged, wherein the voltage of the second node is detected through the sampling line in the preset time period interval.

In the threshold voltage detection method provided by the present application, the step S4 specifically includes: calculating an initial threshold voltage $Vth_n=(Vtrg-Vs_n)*k$, wherein Vtrg is the preset voltage, $Vs_n$ represents a voltage of the second node when the second node is detected for nth times, $Vth_n$ represents an initial threshold voltage when the voltage of the second node is detected for nth times, and wherein k is a constant, and wherein n is an integer greater than 0.

In the threshold voltage detection method provided in the present application, a value of k is between 0 and 1.

In the threshold voltage detection method provided in the present application, the step of acquiring the target threshold voltage according to the initial threshold voltage if the voltage of the second node is equal to the preset voltage, specifically includes:

acquiring a plurality of the initial threshold voltages, and perform a summation operation on the plurality of initial threshold voltages to acquire a target threshold voltage.

In the threshold voltage detection method provided in the present application, the threshold voltage detection method further including:

acquiring values of different information between the threshold voltages of the different pixels according to the differences between the target threshold voltages of the different pixels.

In a second aspect, the present application also provides a threshold voltage device, including:

a pixel including a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node;

an initialization module configured to initialize a voltage of the first node to turn on the driving transistor;

a detection module configured to maintain a driving current flowing through the driving transistor unchanged, and detecting a voltage of the second node after a preset time period interval;

an acquisition module configured to acquire an initial threshold voltage according to a voltage of the second node and a preset voltage;

a comparison module configured to compare the voltage of the second node with a preset voltage;

a calculation module configured to acquire a target threshold voltage according to the initial threshold voltage if the voltage of the second node is equal to the preset voltage.

In the threshold voltage detection device provided in the present application, the threshold voltage detection device further including:

a return module configured to make the initialization module continues to initialize the voltage of the first node to turn on the driving transistor if the voltage of the second node is not equal to the preset voltage.

In the threshold voltage detection device provided by the present application, the initialization module is specifically configured to make the scan line supply a scan signal to turn on the first transistor, and to make the data line supply an initial gate voltage to the first node; wherein $Vdata_n=Vdata_{n-1}+Vth_{n-1}$, wherein n represents a number of initializations, $Vdata_n$ represents an initial gate voltage when the first node is initialized for nth times, $Vdata_{n-1}$ represents an initial gate voltage when the first node is initialized for n−1th times, $Vth_{n-1}$ represents an initial threshold voltage when the voltage of the second node is detected for n−1th times, and wherein n is an integer greater than 1.

In the threshold voltage detection device provided by the present application, the detection module is specifically configured to control the first transistor turn off, control the second transistor turn on, and control the sampling line to be in a floating state to maintain the driving current flowing through the driving transistor unchanged, wherein the voltage of the second node is detected through the sampling line in the preset time period interval.

In the threshold voltage detection device provided by the present application, the acquisition module is specifically configured to calculate an initial threshold voltage $Vth_n=(Vtrg-Vs_n)*k$, wherein Vtrg is the preset voltage, $Vs_n$ represents a voltage of the second node when the second node is detected for nth times, $Vth_n$ represents an initial threshold voltage when the voltage of the second node is detected for nth times, and wherein k is a constant, and wherein n is an integer greater than 0.

In a third aspect, the present application also provides a display device, which includes a threshold voltage detection device, and the threshold voltage detection device includes:

a pixel including a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node;

an initialization module configured to initialize a voltage of the first node to turn on the driving transistor;

a detection module configured to maintain a driving current flowing through the driving transistor unchanged, and detecting a voltage of the second node after a preset time period interval;

an acquisition module configured to acquire an initial threshold voltage according to a voltage of the second node and a preset voltage;

a comparison module configured to compare the voltage of the second node with a preset voltage;

a calculation module configured to acquire a target threshold voltage according to the initial threshold voltage if the voltage of the second node is equal to the preset voltage.

In the display device provided by the present application, the threshold voltage detection device further includes: a return module configured to make the initialization module continues to initialize the voltage of the first node to turn on the driving transistor if the voltage of the second node is not equal to the preset voltage.

In the display device provided by the present application, the initialization module is specifically configured to make the scan line supply a scan signal to turn on the first transistor, and to make the data line supply an initial gate voltage to the first node; wherein $Vdata_n = Vdata_{n-1} + Vth_{n-1}$, wherein n represents a number of initializations, $Vdata_n$ represents an initial gate voltage when the first node is initialized for nth times, $Vdata_{n-1}$ represents an initial gate voltage when the first node is initialized for n−1th times, $Vth_{n-1}$ represents an initial threshold voltage when the voltage of the second node is detected for n−1th times, and wherein n is an integer greater than 1.

In the display device provided by the present application, the detection module is specifically configured to control the first transistor turn off, control the second transistor turn on, and control the sampling line to be in a floating state to maintain the driving current flowing through the driving transistor unchanged, wherein the voltage of the second node is detected through the sampling line in the preset time period interval.

In the display device provided by the present application, the acquisition module is specifically configured to calculate an initial threshold voltage $Vth_n = (Vtrg - Vs_n)*k$, wherein Vtrg is the preset voltage, $Vs_n$ represents a voltage of the second node when the second node is detected for nth times, $Vth_n$ represents an initial threshold voltage when the voltage of the second node is detected for nth times, and wherein k is a constant, and wherein n is an integer greater than 0.

A threshold voltage detection method is provided by the present application. A driving current flowing through the driving transistor during a detection process can be constant by a new detection time sequence. A voltage of the drain electrode of the driving transistor is raised to a preset voltage to acquire a target threshold voltage within a detection time by iterating for multiple iterations by an iterative method. In this way, the driving current flowing through the driving transistor will not decrease with time like a traditional source follower detection method, and the current can be controlled by the detection time and the preset voltage. Therefore, a charging speed of the detection circuit can be very fast during the detection, thereby improving a detection efficiency of the target threshold voltage of the driving transistor, and improving a user experience.

DETAILED DESCRIPTION OF EMBODIMENTS

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application.

In addition, the terms "first", "second", etc. in the specification and claims of the present application are used to distinguish different objects, rather than to describe a specific order. The terms "including" and "having" and any variations of them are intended to cover non-exclusive inclusion. Since a source electrode and a drain electrode of the transistor used in the present application are symmetrical, the source electrode and the drain electrode can be interchanged. According to the form in the figure, it is stipulated that a middle terminal of the transistor is a gate electrode, a signal input terminal is the source electrode, and a signal output terminal is the drain electrode.

Figure 1:
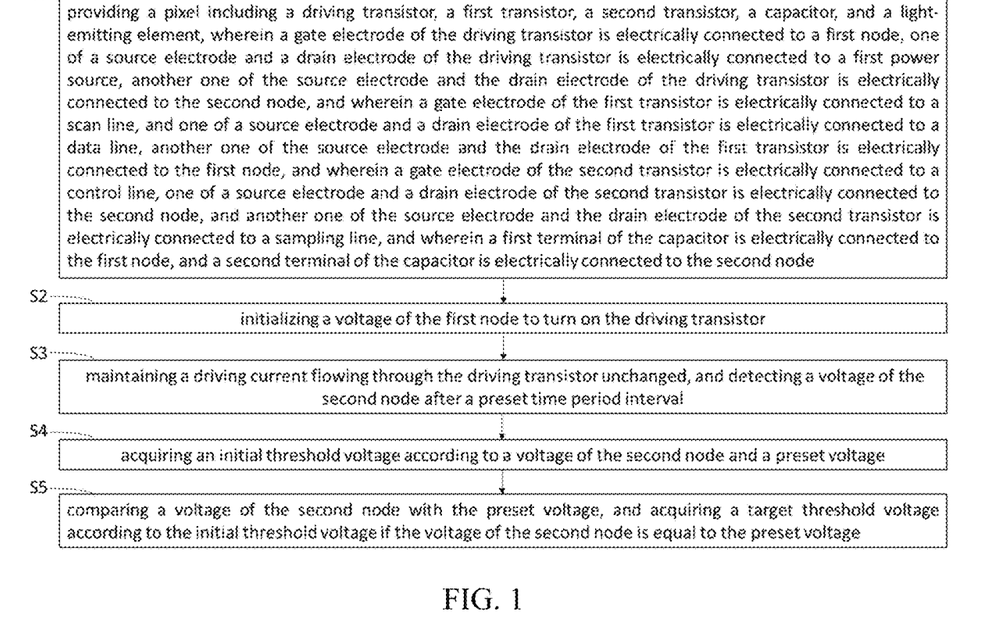
FIG. 1 is a schematic flowchart of a threshold voltage detection method provided by one embodiment of the present application.

Please refer to FIG. 1. FIG. 1 is a schematic flowchart of a threshold voltage detection method provided by one embodiment of the present application. As shown in FIG. 1, the threshold voltage detection method provided by the embodiment of the present application includes the following steps:

Step S1. providing a pixel including a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node.

It should be noted that the pixels provided in the embodiments of the present application are only an example, and those skilled in the art can set the pixels according to specific needs. That is, the pixels provided in the embodiments of the present application not only include the above-described devices, but the pixels provided in the embodiments of the present application may also include other devices. For example, in order to further improve a control of a light emission of the light-emitting element, a transistor can be disposed between a first power supply and the driving transistor, and/or a transistor can be disposed between a second node and the light-emitting element.

The driving transistor is configured to control the driving current flowing through the driving transistor and the light-emitting element. The first transistor is configured to supply the voltage supplied from a data line to the first node (the gate electrode of the driving transistor) under a control of the scan signal supplied from the scan line. The second transistor is configured to supply a voltage supplied by the sampling line to the second node (drain electrode of the driving transistor) under a control of a control signal supplied by the control line. The second transistor is also configured to detect the second node electrically connected to the sampling line under the control of the control signal supplied by the control line. The light-emitting element may be an organic light-emitting diode including an organic light-emitting layer, or an inorganic light-emitting element formed of an inorganic material.

In some embodiments, the driving transistor, the first transistor, and the second transistor may be at least one of low-temperature polysilicon thin film transistors, oxide semiconductor thin film transistors, or amorphous silicon thin film transistors. The transistors in the pixels provided in the embodiments of the present application may be a same type of transistors, therefore the influence of the differences between different types of transistors on the pixels can be avoided.

The threshold voltage detection method provided by the embodiments of the present application utilizes iterative operation (multiple times to initialize the voltage of the first node and multiple times to detect the voltage of the second node), combined with a new detection sequence, to achieve a constant current detection of the voltage of the second node, therefore can greatly improve a detection efficiency.

Figure 2:
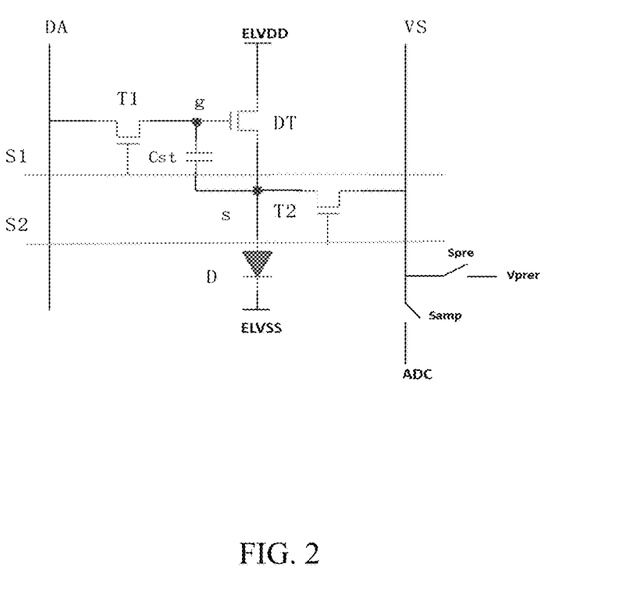
FIG. 2 is a schematic diagram of an equivalent circuit of a pixel provided by one embodiment of the present application.
Figure 3:
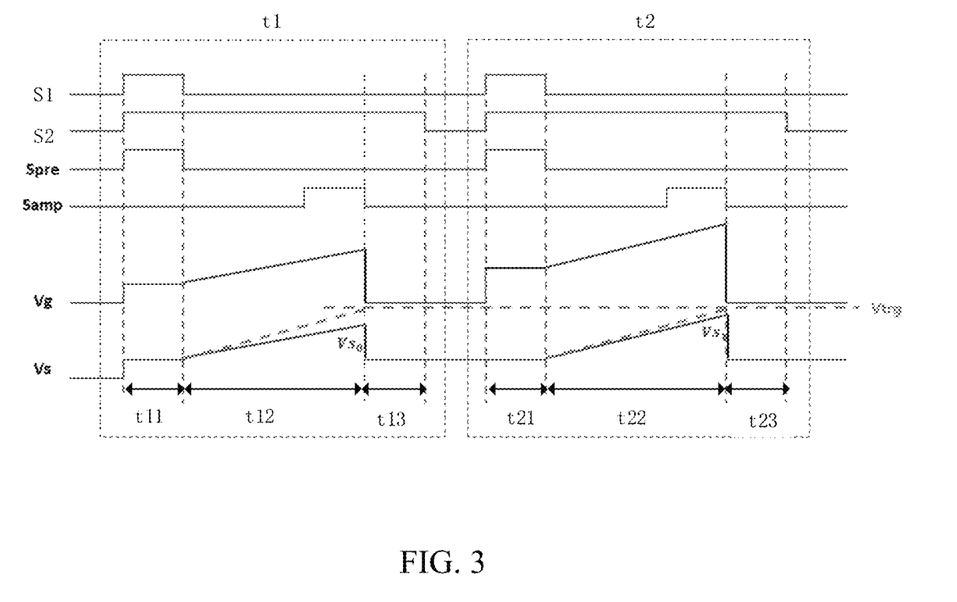
FIG. 3 is a time sequence diagram of the equivalent circuit of the pixel shown in FIG. 2.

Specifically, please refer to FIG. 2 and FIG. 3. FIG. 2 is a schematic diagram of an equivalent circuit of a pixel provided by one embodiment of the application. FIG. 3 is a time sequence diagram of the equivalent circuit of the pixel shown in FIG. 2.

As shown in FIG. 2, the pixel provided by the embodiment of the present application includes a driving transistor DT, a first transistor T1, a second transistor T2, a capacitor Cst, and a light-emitting element D. A gate electrode of the driving transistor DT is electrically connected to a first node g. One of a source electrode and a drain electrode of the driving transistor DT is electrically connected to a first power source ELVDD. Another one of the source electrode and the drain electrode of the driving transistor DT is electrically connected to the second node s. A gate electrode of the first transistor T1 is electrically connected to a scan line S1. One of a source electrode and a drain electrode of the first transistor T1 is electrically connected to a data line DA. Another one of the source electrode and drain electrode of the first transistor T1 is electrically connected to the first node g. A gate electrode of the second transistor T2 is electrically connected to a control line S2. One of a source electrode and a drain electrode of the second transistor T2 is electrically connected to the second node s. Another one of the source electrode and the drain electrode of the second transistor T2 is electrically connected to a sampling line VS. The sampling line VS is electrically connected to a first terminal of a first switching element Samp. A second terminal of the first switching element Samp is electrically connected to a detection source ADC. A sampling line VS is electrically connected to a first terminal of the second switching element Spre. A second terminal of the second switching element Spre is electrically connected to an initial power source Vprer. A first terminal of the capacitor Cst is electrically connected to the first node g. A second terminal of the capacitor Cst is electrically connected to a second node s.

The first switching element Samp is configured to turn on or disconnect a line between the sampling line VS and the detection source ADC. The second switching element Spre is configured to turn on or disconnect the line between the sampling line VS and the initial power source Vprer. The detection source ADC is configured to detect a voltage on the sampling line VS. The initial power source Vprer is configured to provide a preset drain voltage to the sampling line VS.

As shown in FIG. 2 and FIG. 3, the driving sequence of the pixel includes a plurality of iteration time periods t1 (t2). Each iteration time period t1 (t2) includes an initialization time period t11 (t21), a preset time period t12 (t22), and a detection time period t13 (t23). For example, the first iteration time period t1 includes a first initialization time period t11, a first preset time period t12, a first detection time period t13 when a voltage of the second node s is detected first time during a first initialization. The second iteration time period t2 includes a second initialization time period t21, a second preset time period t22, and a second detection period t23 when a voltage of the second node is detected second time during a second initialization.

Specifically, in the first initialization period t11, the scan line S1 supplies a scan signal, to make the first transistor T1 turned on, and the preset gate voltage supplied by the data line DA is supplied to the first node g, to make a voltage of the first node g equal to the preset gate voltage. At the same time, in the first initialization period t11, the control line S2 supplies a control signal to make the second transistor T2 turned on, the first switching element Samp turned off, the second switching element Spre turned on, the initial power source Vprer supplies the preset drain voltage to the second node s, to make the voltage of the second node s is equal to the preset drain voltage. In the first preset time period t12, the scan line S1 stops supplying scan signals, the first transistor T1 turned off, to make the first node g is in a floating state. The first switching element Samp is turned off and the second switching element Spre is turned off, and the control line S2 continues to supply the control signal, and the second transistor T2 is turned on, to make the sampling line VS is in the floating state. At this time, the driving current charges the sampling line VS, to make the voltage of the second node s rises. Because the first node g is in a floating state, according to a capacitive coupling effect, an electrical potential difference between the two terminals of the capacitor Cst remains unchanged. That is, the voltage difference between the first node g and the second node s does not change, therefore the current flows through the driving transistor DT does not change, and the constant current function is realized. In the first detection period t13, the control line S2 continues to supply the control signal, the second transistor T2 is turned on, the second switching element Spre is turned on, and the detection source ADC detects the second node s.

Specifically, in the second initialization period t21, the scan line S1 supplies a scan signal, to make the first transistor T1 is turned on. A preset gate voltage supplied by the data line DA is supplied to the first node g, therefore a voltage of the first node g is the same as the preset gate voltage. At the same time, in the second initialization period t21, the control line S2 supplies a control signal, to make the second transistor T2 turned on, the first switching element Samp turned off, the second switching element Spre turned on, and the initial power source Vprer supplies the preset drain voltage to the second node s, to make the voltage of the second node s is equal to a preset drain voltage. In the second preset time period t22, the scan line S1 stops supplying scan signals, the first transistor T1 turned off, to make the first node g in a floating state. The first switching element Samp is turned off and the second switching element Spre is turned off, the control line S2 continues to supply the control signal, and the second transistor T2 is turned on, to make the sampling line VS in the floating state. At this time, the driving current charges the sampling line VS, to make the voltage of the second node s raised. Because the first node g is in the floating state, the electrical potential difference between the two terminals of the capacitor Cst remains unchanged according to a capacitive coupling effect, that is, a voltage difference between the first node g and the second node s does not change, so the current flows through the driving transistor DT does not change, and a constant current function is realized. In the second detection period t23, the control line S2 continues to supply the control signal, the second transistor T2 turned on, the second switching element Spre turned on, and the detection source ADC detects the second node s.

Step S2, initializing a voltage of the first node to turn on the driving transistor.

This embodiment of the present application needs to initialize the first node g and the second node s multiple times. It should be noted that, the initializations of the first node g multiple times are not continuous, and the values of the initializations of the first node g are different each time. The initializations of the second node s are not continuous, and the values of the initializations of the second node s are the same each time. For example: after the first node g is initialized for the first time, other steps are performed first, and after the other steps are performed, the first node g can be initialized for the second time, wherein the voltage of the first node g after the first node g is initialized for the first time is not equal to the voltage of the first node g after the first node g is initialized for the second time. When the second node s is initialized for the first time, other steps are performed first, and after the other steps are performed, the second node s can be initialized for the second time, wherein the voltage of the second node s after the first initialization of the second node s is equal to the voltage of the second node after the second initialization of the second node s.

Specifically, when the first node g is initialized for the first time, step S2 specifically includes: the scan line S1 supplies a scan signal to turn on the first transistor T1, and the data line DA supplies the preset gate voltage to the first node g. The control line S2 supplies a control signal to turn on the second transistor T2 is turned on, and the sampling line VS supplies the preset drain voltage to the second node s. When the first node g is initialized for nth times, step S2 specifically includes: the scan line S1 supplying the scan signal to turn on the first transistor T1, and the data line DA supplies the initial gate voltage to the first node g; wherein $Vdata_n = Vdata_n = Vdata_{n-1} + Vth_{n-1}$. n represents a number of initializations, $Vdata_n$ represents an initial gate voltage when the first node is initialized for the nth times, and $Vdata_{n-1}$ represents an initial gate voltage when the first node is initialized for the n−1th time, $Vth_{n-1}$ represents an initial threshold voltage when the voltage of the second node is detected for the n−1th times, and wherein n is an integer greater than 1.

In the embodiment of the present application, the voltage of the first node g is the preset gate voltage after the first node g is initialized for the first time, and the preset voltage can be set as required. The voltage of the first node g after the first node g is initialized for the nth time can be calculated according to the above formula. The voltage of the second node s is equal to the preset drain voltage after the second node s is initialized, and the preset drain voltage can be set as required.

In this embodiment of the present application, a difference between the preset gate voltage and the preset drain voltage is greater than a threshold voltage of the driving transistor DT, and a difference between the initial gate voltage and the preset drain voltage is greater than the threshold voltage of the driving transistor DT. The driving transistor DT can be turned on when the first node g and the second node s are initialized.

Step S3, maintaining a driving current flowing through the driving transistor unchanged, and detecting a voltage of the second node after a preset time period interval.

This embodiment of the present application needs to detect the voltage of the second node s multiple times. It should be noted that the multiple detections of the voltage of the second node s are not continuous. For example, when the voltage of the second node s is detected for the first time, other steps are performed first, and after the other steps are performed, the voltage of the second node s can be detected for the second time.

Specifically, step S3 specifically includes: controlling the first transistor T1 to turn off, controlling the second transistor T2 turn on, and controlling the sampling line VS to be in a floating state, to maintain the driving current flowing through the driving transistor DT unchanged, wherein the voltage of the second node s is detected through the sampling line VS in the preset time period interval. The first transistor T1 is turned off, to make the first node g in a floating state; the second transistor T2 is turned on, and the sampling line VS is in a floating state. At this time, the driving current charges the sampling line VS, causing the voltage of the second node s to raise. Because the first node g is in the floating state, the potential difference between the two terminals of the capacitor Cst remains unchanged according to the capacitive coupling effect. That is, the voltage difference between the first node g and the second node s does not change, so the current flows through the driving transistor DT does not change, and the constant current function is realized.

Step S4: acquiring an initial threshold voltage according to a voltage of the second node and a preset voltage.

This embodiment of the present application needs to acquire multiple initial threshold voltages. For example: After the voltage of the second node s is detected for the first time, the first initial threshold voltage is acquired according to the voltage of the second node s after the first detection and the preset voltage; After the voltage of the second node s is detected for the second time, the second initial threshold voltage is acquired according to the voltage of the second node s after the first detection and the preset voltage.

Specifically, step S4 includes: calculating an initial threshold voltage $Vth_n=(Vtrg-Vs_n)*k$, wherein Vtrg is the preset voltage, $Vs_n$ represents a voltage of the second node when the second node is detected for nth times, $Vth_n$ represents an initial threshold voltage when the voltage of the second node is detected for nth times, and wherein k is a constant, and wherein n is an integer greater than 0.

Figure 4:
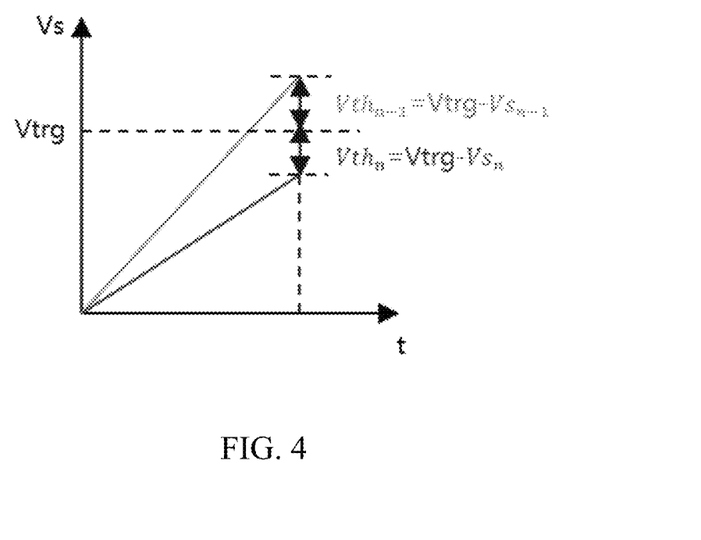
FIG. 4 is a schematic diagram illustrating a dichotomous iterative calculation provided by one embodiment of the present application.

It should be noted that, in the embodiment of the present application, due to the constant current characteristics of the driving current flowing through the driving transistor DT, when the detection conditions and the characteristics of the driving transistor DT meet certain conditions, it will cause the voltage of the second node S to be iteratively detected to fluctuate with respect to the preset voltage, wherein convergence cannot be achieved or more iterations are needed to reach the voltage of the second node S detected to converge to the preset voltage. Based on this, the embodiment of the present application uses an idea of dichotomy to further improve a detection efficiency and improve a non-convergence of the detection result. Specifically describes as follows:

Please refer to FIG. 4, FIG. 4 is a schematic diagram illustrating a dichotomous iterative calculation provided by one embodiment of the present application. As shown in FIG. 4, with the iterative detection of the voltage of the second node S, when the voltage relationship meets certain conditions, the voltage of the second node S detected in each iteration will fluctuate about the preset voltage. At this time, a relationship between voltage and current satisfies the following formula:

$$\begin{cases} Vg_{n-1} = Vg_n + Vth_{n-1} \\ Vg_n = Vg_{n-1} + Vth_n \end{cases}$$

$$\begin{cases} Vg_{n-1} = Vg_n + Vth_{n-1} \\ Vg_n = Vg_{n-1} + Vth_n \end{cases}$$

That is, $Vs_{n-1}+Vs_n=2Vtrg$.

When the above equation relationship is satisfied, iteratively detecting the voltage of the second node s will be difficult to converge to the preset voltage, or when it is close to this relationship, the convergence speed will slow down. In order to avoid this situation and speed up the completion of the iteration, the calculation process needs to be changed to break an equilibrium state of the physical conditions (that is, the above equation is not satisfied), so a coefficient term k is introduced according to the dichotomy idea.

A mathematical definition of the dichotomy is: for a function $y=f(x)$ that is continuous and $f(a)*f(b)<0$ in the interval $[a,b]$, by continuously dividing the interval where the zero point of the function $f(x)$ is in two, the two terminal points of the interval are gradually approaching the zero point, and then the method of acquiring the approximate value of the zero point is called dichotomy. Using the idea of dichotomy, the Vg voltage is a solution we need when V s=Vtrg is a zero point of the function. The continuous iteration process is the process of gradually reducing the solution interval, wherein the way to reduce is to add the Vthn calculated in each iteration to Vgn−1; when $Vth_n$ is multiplied by the coefficient k (0<k<1), because $Vg_n=Vg_{n-1}+Vth_n$, therefore changing a value of $Vth_n$ by the coefficient k is to change $Vg_n$, and the continuous change of $Vg_n$ can break a balance of the equation, so as to achieve a gradual approach to a real solution.

That is, in the embodiment of the present application, the value of k is between 0-1. A value of k is directly related to a speed of iterative convergence, too small or too large will increase a number of iterations.

In some embodiments, a value of k may be 0.4, 0.5, 0.6, 0.7.

Figure 5:
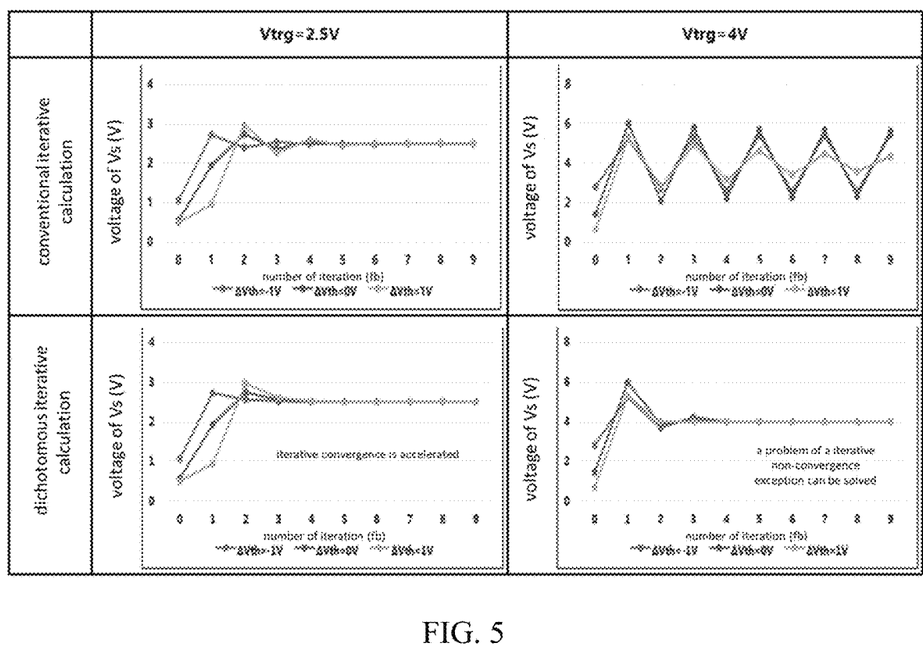
FIG. 5 is a schematic diagram of a comparison between the dichotomous iterative calculation and the conventional iterative calculation provided by one embodiment of the present application.

For example, please refer to FIG. 5, FIG. 5 is a schematic diagram of a comparison between the dichotomous iterative calculation and the conventional iterative calculation provided by one embodiment of the present application. As shown in FIG. 5, when the preset voltage is equal to 2.5V, the dichotomous iterative calculation can accelerate the iterative convergence compared to a conventional iterative calculation; when the preset voltage is to 4V, the dichotomous iterative calculation can solve a problem of the iterative non-convergence exception compared to the conventional iterative calculation. That is, in the embodiment of the present application, the value of k and the value of the preset voltage may be set to further solve the problem of non-convergence of iteration. In one embodiment, the value of k is equal to 0.5, and the value of the preset voltage is equal to 2.5V. In another embodiment, the value of k is equal to 0.5, and the value of the preset voltage is equal to 4V.

In this embodiment of the present application, the preset voltage is greater than the preset drain voltage. Thereby, it is possible to determine the value of the drive current flowing through the driving transistor during detection and the preset voltage. The larger the driving current, the faster the charging speed to the sampling line, which can shorten the detection preset time period and further improve the detection efficiency.

Step S5: comparing a voltage of the second node with the preset voltage, and acquiring a target threshold voltage according to the initial threshold voltage if the voltage of the second node is equal to the preset voltage.

Further, the threshold voltage detection method further includes: if the voltage of the second node is not equal to the preset voltage, returning to step S2.

The voltage of the second node S is compared with the preset voltage, if the voltage of the second node S is not equal to the preset voltage. That is, in the threshold voltage detection method provided in the embodiment of the present application, step S1 is performed first, then step S2 is performed, then step S3 is performed, and step S4 is performed immediately. If the voltage of the second node is not equal to the preset voltage, then continue to perform step S2, step S3, and step S4 until the voltage of the second node is equal to the preset voltage, and then the target threshold voltage is acquired according to the initial threshold voltage.

Specifically, the step of acquiring the target threshold voltage according to the initial threshold voltage if the voltage of the second node s is equal to the preset voltage, specifically includes: acquiring a plurality of the initial threshold voltages, and perform a summation operation on the plurality of initial threshold voltages to acquire a target threshold voltage.

The threshold voltage detection method provided by the present application realizes a driving current flowing through the driving transistor during a detection process can be constant by a new detection time sequence, a voltage of the drain electrode of the driving transistor is raised to a preset voltage within a detection time by iterating for multiple iterations by an iterative method, to acquire a target threshold voltage. In this way, the driving current flowing through the driving transistor will not decrease with time like a traditional source follower detection method, and the current can be controlled by the detection time and the preset voltage. Therefore, a charging speed of the detection circuit can be very fast in the detection, thereby improving a detection efficiency of the target threshold voltage of the driving transistor, and improving a user experience.

Further, the threshold voltage detection method provided in the embodiment of the present application further includes: acquiring values of different information between the threshold voltages of the different pixels according to the differences between the target threshold voltages of the different pixels.

It should be noted that the calculated target threshold voltage is not the true threshold voltage of the driving transistor, but a value that contains information about the true threshold voltage difference of different driving transistors. Although it is not the true threshold voltage, it can eliminate a difference in threshold voltage during compensation, so it can also achieve a purpose of eliminating display unevenness.

The threshold voltage detection method provided by the present application realizes a driving current flowing through the driving transistor during a detection process can be constant by a new detection time sequence, a voltage of the drain electrode of the driving transistor is raised to a preset voltage within a detection time by iterating for multiple iterations by an iterative method, to acquire a target threshold voltage. In this way, the driving current flowing through the driving transistor will not decrease with time like a traditional source follower detection method, and the current can be controlled by the detection time and the preset voltage. Therefore, a charging speed of the detection circuit can be very fast in the detection, thereby improving a detection efficiency of the target threshold voltage of the driving transistor, and improving a user experience. At the same time, the threshold voltage difference can be eliminated during compensation, to achieve a purpose of eliminating uneven display.

One embodiment of the present application also provides a threshold voltage detection device, which includes:
  a pixel including a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node;
  an initialization module configured to initialize a voltage of the first node to turn on the driving transistor;
  a detection module configured to maintain a driving current flowing through the driving transistor unchanged, and detecting a voltage of the second node after a preset time period interval;
  an acquisition module configured to acquire an initial threshold voltage according to a voltage of the second node and a preset voltage;
  a comparison module configured to compare the voltage of the second node with a preset voltage;
  a calculation module configured to acquire a target threshold voltage according to the initial threshold voltage if the voltage of the second node is equal to the preset voltage.

It should be noted that the threshold voltage detection device provided in the embodiment of the present application adopts the above-mentioned threshold voltage detection method. For details, please refer to the above description, which will not be repeated here.

The threshold voltage detection device provided by the present application realizes a driving current flowing through the driving transistor during a detection process can be constant by a new detection time sequence, a voltage of the drain electrode of the driving transistor is raised to a preset voltage within a detection time by iterating for multiple iterations by an iterative method, to acquire a target threshold voltage. In this way, the driving current flowing through the driving transistor will not decrease with time like a traditional source follower detection method, and the current can be controlled by the detection time and the preset voltage. Therefore, a charging speed of the detection circuit can be very fast in the detection, thereby improving a detection efficiency of the target threshold voltage of the driving transistor, and improving a user experience. At the same time, the threshold voltage difference can be eliminated during compensation, to achieve a purpose of eliminating uneven display.

One embodiment of the present application also provides a display device, which includes the above-mentioned threshold voltage detection device. For details, please refer to the above description, which will not be repeated here.

The display device provided by the present application realizes a driving current flowing through the driving transistor during a detection process can be constant by a new detection time sequence, a voltage of the drain electrode of the driving transistor is raised to a preset voltage within a detection time by iterating for multiple iterations by an iterative method, to acquire a target threshold voltage. In this way, the driving current flowing through the driving transistor will not decrease with time like a traditional source follower detection method, and the current can be controlled by the detection time and the preset voltage. Therefore, a charging speed of the detection circuit can be very fast in the detection, thereby improving a detection efficiency of the target threshold voltage of the driving transistor, and improving a user experience. At the same time, the threshold voltage difference can be eliminated during compensation, to achieve a purpose of eliminating uneven display.

The above are only examples of the present application, and do not limit a scope of the present application. Any equivalent structure or equivalent process transformation made by using the content of the description and figures of the present application, or directly or indirectly applied to other related technical fields, are similarly included in the scope of patent protection of the present application.

What is claimed is:

1. A threshold voltage detection method, comprising:
    step S1, providing a pixel comprising a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node;
    step S2, initializing a voltage of the first node to turn on the driving transistor;
    step S3, maintaining a driving current flowing through the driving transistor unchanged, and detecting a voltage of the second node after a preset time period interval;
    step S4: acquiring an initial threshold voltage according to the voltage of the second node and a preset voltage;
    step S5: comparing the voltage of the second node with the preset voltage, and acquiring a target threshold voltage according to the initial threshold voltage if the voltage of the second node is equal to the preset voltage.

2. The threshold voltage detection method according to claim 1, wherein the threshold voltage detection method further comprises returning to step S2 if the voltage of the second node is not equal to the preset voltage.

3. The threshold voltage detection method according to claim 2, wherein the step S2 specifically comprises: the scan line suppling a scan signal to turn on the first transistor, and the data line suppling an initial gate voltage to the first node, wherein
    $Vdata_n=Vdata_{n-1}+Vth_{n-1}$, wherein n represents a number of initializations, $Vdata_n$ represents an initial gate voltage when the first node is initialized for nth times, $Vdata_{n-1}$ represents an initial gate voltage when the first node is initialized for n−1th times, $Vth_{n-1}$ represents an initial threshold voltage when the voltage of the second node is detected for n−1th times, and wherein n is an integer greater than 1.

4. The threshold voltage detection method according to claim 3, wherein when the first node is initialized first time, the step S2 specifically comprises: the scan line supplying the scan signal to turn on the first transistor, the data line supplying a preset gate voltage to the first node; and the control line suppling a detection control signal to turn on the second transistor, and the sampling line suppling a preset drain voltage to the second node.

5. The threshold voltage detection method according to claim 4, wherein the preset voltage is greater than the preset drain voltage, and wherein a difference value between the preset gate voltage and the preset drain voltage is greater than the threshold voltage of the driving transistor.

6. The threshold voltage detection method according to claim 2, wherein the step S3 specifically comprises: controlling the first transistor turned off, controlling the second transistor turned on, and controlling the sampling line to be in a floating state, to maintain the driving current flowing through the driving transistor unchanged, wherein the voltage of the second node is detected through the sampling line in the preset time period interval.

7. The threshold voltage detection method according to claim 2, wherein the step S4 specifically comprises: calculating an initial threshold voltage $Vth_n=(Vtrg-Vs_n)*k$, wherein Vtrg is the preset voltage, $Vs_n$ represents a voltage of the second node when the second node is detected for nth times, $Vth_n$ represents an initial threshold voltage when the voltage of the second node is detected for nth times, and wherein k is a constant, and wherein n is an integer greater than 0.

8. The threshold voltage detection method according claim 7, wherein a value of k is between 0 and 1.

9. The threshold voltage detection method according to claim 2, wherein the step of acquiring the target threshold voltage according to the initial threshold voltage if the voltage of the second node is equal to the preset voltage, specifically comprises:
    acquiring a plurality of the initial threshold voltages, and perform a summation operation on the plurality of initial threshold voltages to acquire a target threshold voltage.

10. The threshold voltage detection method according to claim 1, further comprising:
    acquiring values of different information between the threshold voltages of the different pixels according to the differences between the target threshold voltages of the different pixels.

11. A threshold voltage detection device, comprising:
    a pixel comprising a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node;

an initialization module configured to initialize a voltage of the first node to turn on the driving transistor;

a detection module configured to maintain a driving current flowing through the driving transistor unchanged, and detecting a voltage of the second node after a preset time period interval;

an acquisition module configured to acquire an initial threshold voltage according to the voltage of the second node and a preset voltage;

a comparison module configured to compare the voltage of the second node with a preset voltage;

a calculation module configured to acquire a target threshold voltage according to the initial threshold voltage if the voltage of the second node is equal to the preset voltage.

12. The threshold voltage detection device according to claim 11, further comprising:

a return module configured to make the initialization module continues to initialize the voltage of the first node to turn on the driving transistor if the voltage of the second node is not equal to the preset voltage.

13. The threshold voltage detection device according to claim 12, wherein the initialization module is specifically configured to make the scan line supply a scan signal to turn on the first transistor, and to make the data line supply an initial gate voltage to the first node; wherein $Vdata_n = Vdata_{n-1} + Vth_{n-1}$, wherein n represents a number of initializations, $Vdata_n$ represents an initial gate voltage when the first node is initialized for nth times, $Vdata_{n-1}$ represents an initial gate voltage when the first node is initialized for n−1th times, $Vth_{n-1}$ represents an initial threshold voltage when the voltage of the second node is detected for n−1th times, and wherein n is an integer greater than 1.

14. The threshold voltage detection device according to claim 12, wherein the detection module is specifically configured to control the first transistor turn off, control the second transistor turn on, and control the sampling line to be in a floating state to maintain the driving current flowing through the driving transistor unchanged, wherein the voltage of the second node is detected through the sampling line in the preset time period interval.

15. The threshold voltage detection device according to claim 12, wherein the acquisition module is specifically configured to calculate an initial threshold voltage $Vth_n = (Vtrg - Vs_n)*k$, wherein Vtrg is the preset voltage, $Vs_n$ represents a voltage of the second node when the second node is detected for nth times, $Vth_n$ represents an initial threshold voltage when the voltage of the second node is detected for nth times, and wherein k is a constant, and wherein n is an integer greater than 0.

16. A display device comprising a threshold voltage detection device, wherein the threshold voltage detection device comprises:

a pixel comprising a driving transistor, a first transistor, a second transistor, a capacitor, and a light-emitting element, wherein a gate electrode of the driving transistor is electrically connected to a first node, one of a source electrode and a drain electrode of the driving transistor is electrically connected to a first power source, another one of the source electrode and the drain electrode of the driving transistor is electrically connected to the second node, and wherein a gate electrode of the first transistor is electrically connected to a scan line, one of a source electrode and a drain electrode of the first transistor is electrically connected to a data line, another one of the source electrode and the drain electrode of the first transistor is electrically connected to the first node, and wherein a gate electrode of the second transistor is electrically connected to a control line, one of a source electrode and a drain electrode of the second transistor is electrically connected to the second node, and another one of the source electrode and the drain electrode of the second transistor is electrically connected to a sampling line, and wherein a first terminal of the capacitor is electrically connected to the first node, and a second terminal of the capacitor is electrically connected to the second node;

an initialization module configured to initialize a voltage of the first node to turn on the driving transistor;

a detection module configured to maintain a driving current flowing through the driving transistor unchanged, and detecting a voltage of the second node after a preset time period interval;

an acquisition module configured to acquire an initial threshold voltage according to the voltage of the second node and a preset voltage;

a comparison module configured to compare the voltage of the second node with a preset voltage;

a calculation module configured to acquire a target threshold voltage according to the initial threshold voltage if the voltage of the second node is equal to the preset voltage.

17. The display device according to claim 16, further comprising:

a return module configured to make the initialization module continues to initialize the voltage of the first node to turn on the driving transistor if the voltage of the second node is not equal to the preset voltage.

18. The display device according to claim 17, wherein the initialization module is specifically configured to make the scan line supply a scan signal to turn on the first transistor, and to make the data line supply an initial gate voltage to the first node; wherein $Vdata_n = Vdata_{n-1} + Vth_{n-1}$, wherein n represents a number of initializations, $Vdata_n$ represents an initial gate voltage when the first node is initialized for nth times, $Vdata_{n-1}$ represents an initial gate voltage when the first node is initialized for n−1th times, $Vth_{n-1}$ represents an initial threshold voltage when the voltage of the second node is detected for n−1th times, and wherein n is an integer greater than 1.

19. The display device according to claim 17, wherein the detection module is specifically configured to control the first transistor turn off, control the second transistor turn on, and control the sampling line to be in a floating state to maintain the driving current flowing through the driving transistor unchanged, wherein the voltage of the second node is detected through the sampling line in the preset time period interval.

20. The display device according to claim 17, wherein the acquisition module is specifically configured to calculate an initial threshold voltage $Vth_n = (Vtrg - Vs_n)*k$, wherein Vtrg is the preset voltage, $Vs_n$ represents a voltage of the second node when the second node is detected for nth times, $Vth_n$ represents an initial threshold voltage when the voltage of the second node is detected for nth times, and wherein k is a constant, and wherein n is an integer greater than 0.

* * * * *